United States Patent
Chang et al.

(10) Patent No.: US 7,751,908 B2
(45) Date of Patent: Jul. 6, 2010

(54) METHOD AND SYSTEM FOR THERMAL PROCESS CONTROL

(75) Inventors: Yung-Chih Chang, Fongshan (TW); Cheng-I Sun, Taipei (TW); Chun-I Kuo, Tainan (TW); Fu-Kun Yeh, Jhutian Hsiang (TW); Hsueh-Chi Shen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1258 days.

(21) Appl. No.: 11/001,767

(22) Filed: Dec. 2, 2004

(65) Prior Publication Data

US 2006/0122728 A1 Jun. 8, 2006

(51) Int. Cl.
*G06F 19/00* (2006.01)
*G05D 7/00* (2006.01)

(52) U.S. Cl. .......... 700/29; 700/121; 700/124; 700/299

(58) Field of Classification Search .......... 700/121, 700/124, 299
See application file for complete search history.

(56) References Cited

U.S. PATENT DOCUMENTS

| | | | | |
|---|---|---|---|---|
| 5,436,172 A | * | 7/1995 | Moslehi | 374/121 |
| 6,373,033 B1 | * | 4/2002 | de Waard et al. | 219/497 |
| 6,819,963 B2 | * | 11/2004 | Riley et al. | 700/29 |
| 6,856,849 B2 | * | 2/2005 | Riley et al. | 700/121 |
| 6,960,416 B2 | * | 11/2005 | Mui et al. | 430/30 |
| 7,025,280 B2 | * | 4/2006 | Kaushal et al. | 236/16 |
| 7,101,816 B2 | * | 9/2006 | Kaushal et al. | 438/795 |
| 7,127,358 B2 | * | 10/2006 | Yue et al. | 702/30 |
| 7,415,312 B2 | * | 8/2008 | Barnett et al. | 700/29 |
| 2008/0046111 A1 | * | 2/2008 | Kataoka et al. | 700/207 |

OTHER PUBLICATIONS

"Adaptive Optimization of Run-To-Run Controllers: The EWMA Example", Patel et al, IEEE Transactions on Semiconductor Engineering vol. 13, No. 1, Feb. 2000.*
"A Monitor Wafer Based Controller for Semiconductor Processes", Mozumder et al, IEEE Transactions on Semiconductor Manufacturing, vol. 7, No. 3, Aug. 2004.*

* cited by examiner

*Primary Examiner*—Michael D Masinick
(74) *Attorney, Agent, or Firm*—Thomas, Kayden, Horstemeyer & Risley

(57) ABSTRACT

A thermal process system. The thermal process system comprises a thermal processor, a metrology tool, and a controller. The thermal processor performs a thermal process as defined by a heating model to form a film on a wafer surface. The metrology tool, interfaced with the thermal processor, inspects thickness of the film. The controller, coupled with the thermal processor and the metrology tool, generates the heating model of the thermal processor and calibrates the heating model according to a preset slope coefficient matrix and the measured thickness.

6 Claims, 4 Drawing Sheets

METHOD AND SYSTEM FOR THERMAL PROCESS CONTROL

BACKGROUND

The present invention relates to controlling the process temperature in a multi-zone thermal processor. In particular, the invention pertains to model-based predictive temperature control of multi-zone thermal processor.

A multi-zone thermal processor, such as a furnace, is widely used in semiconductor manufacturing, especially in thin film processes such as an oxidation process. The oxidation process plays a major role in wafer manufacturing, wherein an oxide layer is thermally grown or deposited on the surface of a wafer. A deposited oxide layer is produced on a wafer by providing externally supplied high-purity oxygen and silicon source in an elevated temperature environment to react and form a film on the silicon substrate. The deposition of the oxide layer is controlled and limited by the reaction of oxygen and silicon, wherein the reaction is greatly influenced by temperature, thus the growth rate of oxide is highly temperature-sensitive. Therefore, the ability to precisely control temperature in the furnace tube, where the oxidation occurs, is critical in wafer manufacturing. The thin film not only deposits on the surface of the silicon substrate, but also on the inner wall of the furnace tube. The deposited material on the inner wall hinders heat conduction and lowers the heating efficiency.

Conventionally, the temperature setting adjustment of the furnace is performed manually between two consecutive runs to compensate the heating efficiency loss resulted from deposition on the inner wall of the furnace tube. The manual adjustment is mistake-prone and time-consuming, resulting in high manufacture cost.

Hence, there is a need for a thermal process that addresses the problems arising from the existing technology.

SUMMARY

It is therefore an object of the invention to provide a system and method for thermal processing capable of automatically adjusting the temperature setting of heating elements of a furnace between process runs.

To achieve this and other objects, the present invention provides system and method capable of analyzing film thickness measurements and adjusting the temperature setting of heating elements of a furnace to compensate temperature deviation due to changed thermal conductivity.

The present invention provides a thermal process system comprising a thermal processor, a metrology tool, and a controller. The thermal processor performs a thermal process as defined by a heating model to form a thin film on a wafer surface. The metrology tool, interfaced with the thermal processor, measures film thickness. The controller, coupled with the thermal processor and the metrology tool, generates the heating model of the thermal processor and calibrates the heating model according to a preset slope coefficient matrix and the measured thickness.

The invention also provides a thermal process method implemented in the aforementioned system. First, a slope coefficient matrix is provided. Second, a first heating model is defined. Then a first process run of a first wafer batch is performed as defined by the first heating model. After the first process run is finished, the film thickness of at least one wafer of the first wafer batch is measured. Next, a statistical process control analysis is performed using the slope coefficient matrix and the film thickness measurement. Then a temperature setting of a next process run can be determined according to the relationship between temperature and film thickness measurements. Then, the first heating model is modified according to results of the statistical process control analysis to obtain a second heating model. Next, a second process run of a second wafer batch is performed as defined by the second heating model.

The above-mentioned method may take the form of program code embodied in a tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The present invention will now be described with reference to FIGS. 1 to 3, which in general relate to a thermal process system.

Figure 1:
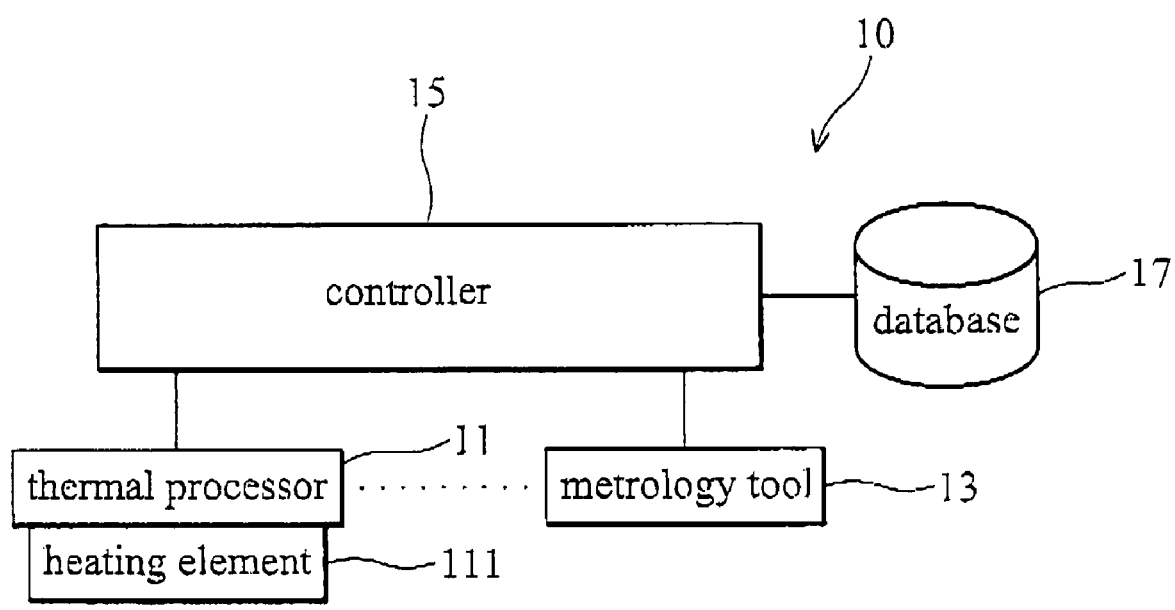
FIG. 1 is a schematic view showing a thermal process system according to the present invention.

FIG. 1 is a schematic view showing a thermal process system according to the present invention. The thermal process system 10 contains a thermal processor 11, a metrology tool 13, a controller 15, and a database 17.

Thermal processor 11 is a hot-wall batch furnace, such as a vertical or horizontal furnace, which performs a thermal process as defined by a heating model to form a thin film on a wafer surface. Thermal processor 11 generally has 3~5 heating zones with load size of up to 100~200 wafers, wherein each heating zone corresponds to a heating element 111. Metrology tool 13, interfaced with the thermal processor, measures film thickness after a process run to obtain film thickness measurements of processed wafers. Controller 15, coupled with the thermal processor and the metrology tool, is used for run-to-run temperature control of the thermal processor 11. Controller 15 generates the heating model of thermal processor 11 and calibrates the heating model according to a preset slope coefficient matrix and the measured thickness. The database 17 stores the slope coefficient matrix, the film thickness measurements, and a plurality of process rules. The slope coefficient matrix is determined experimentally and specifies relationship of temperature of heating element 111 and film thickness measurements. The film thickness measurements are obtained from wafers located in different positions of the furnace tube. The process rules specify a statistical process control method for heating model calibration.

Figure 2A:
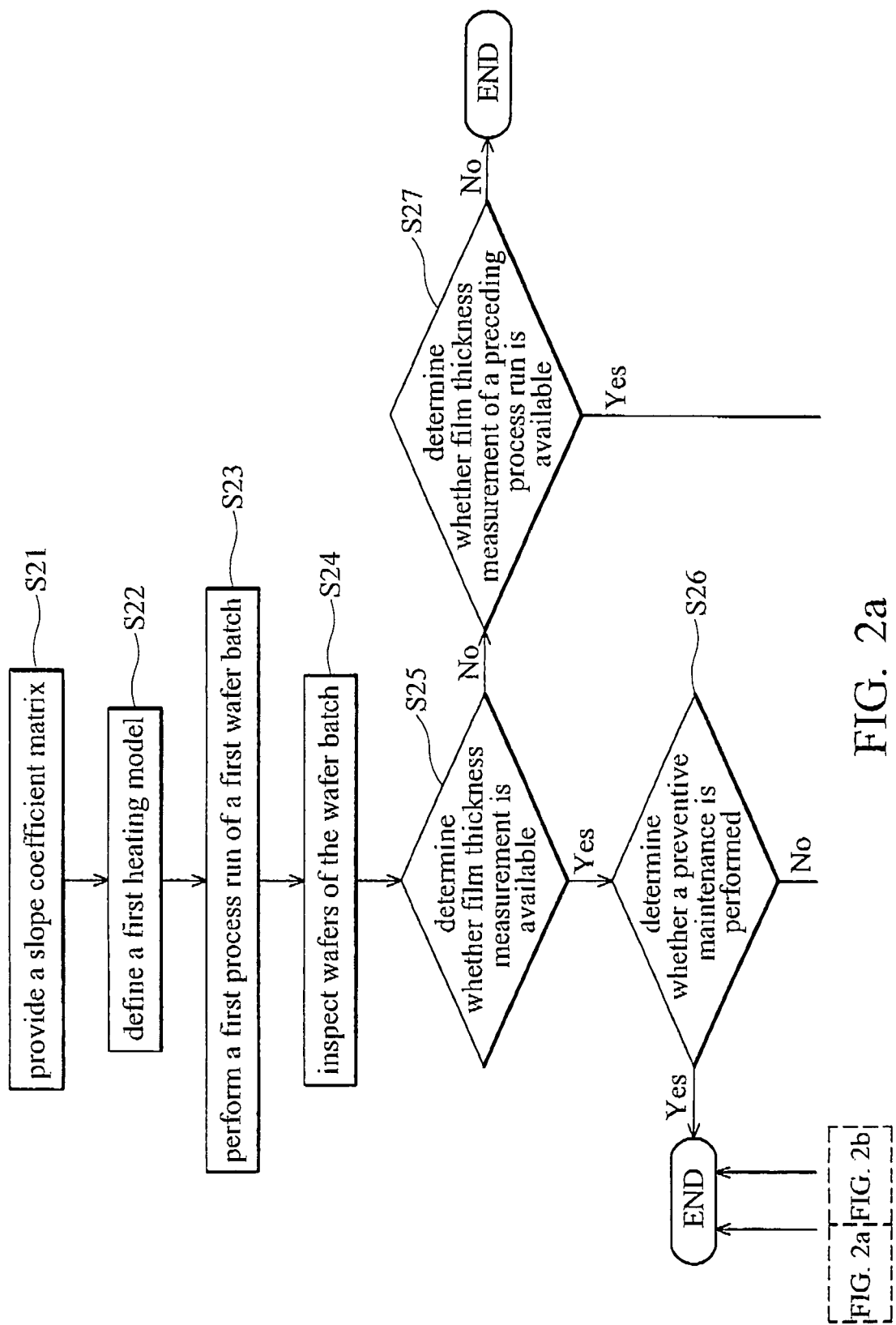
FIG. 2 illustrates a flowchart of the thermal process method with run-to-run temperature control of the system in FIG. 1.
Figure 2B:
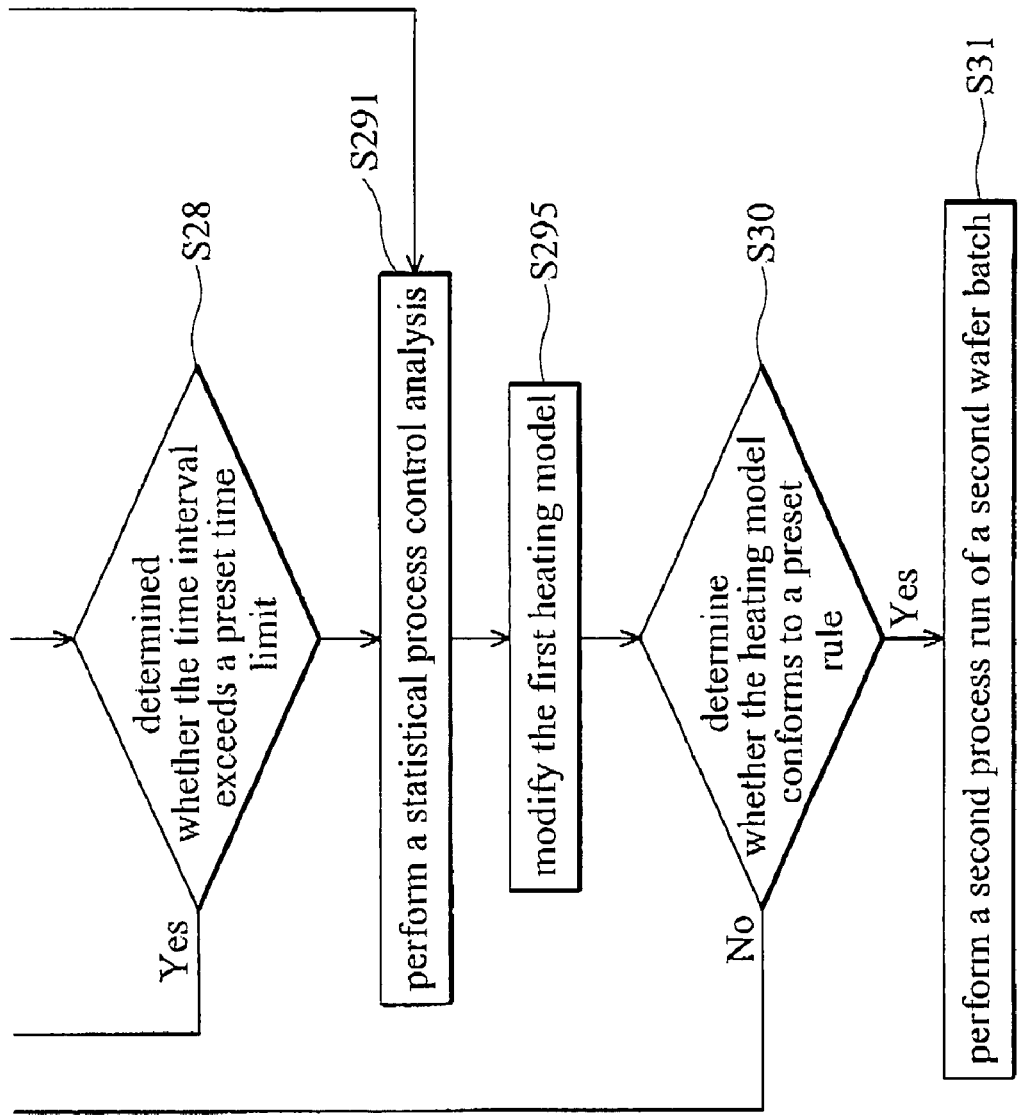

FIG. 2 illustrates a flowchart of the thermal process method with run-to-run temperature control of the system in FIG. 1. According to this embodiment, the thermal processor 11 is a Tokyo Electron Limited (TEL) vertical furnace, having 5 heating elements. There are 3 film thickness measurements obtained from wafers in upper, central, and lower positions of the furnace tube, respectively.

First, a slope coefficient matrix is provided (step S21). The slope coefficient matrix is determined by design of experiment (DOE) using multiple linear regression to analyze temperature settings and film thickness measurements of previous process runs. The slope coefficient matrix is a (M×N) matrix, wherein the M equals to the number of film thickness measurements of a certain process run and the N equals to the number of heating elements in a furnace performing the thermal process. According to this embodiment, there are 3 film thickness measurements for a certain process run and 5 heating elements for the thermal processor. Therefore, the slope coefficient matrix is a (3×5) matrix. The relationship among film thickness measurements, slope coefficient matrix, and temperature settings of the furnace tube is shown in model 1, wherein the film thickness measurements, the slope coefficient matrix, and the temperature setting are denoted as Y, B, and T, respectively.

$$Y \propto BT \quad \text{(model 1)}$$

$$\begin{bmatrix} Y_{t,u} \\ Y_{t,c} \\ Y_{t,l} \end{bmatrix} \propto \begin{bmatrix} -7.22 & -12.74 & -7.67 & 12.05 & 18.38 \\ -9.15 & -7.18 & 25.74 & 4.37 & 1.37 \\ 20.37 & 22.37 & 9.19 & -0.12 & -4.04 \end{bmatrix} \begin{bmatrix} T_{t,1} \\ T_{t,2} \\ T_{t,3} \\ T_{t,4} \\ T_{t,5} \end{bmatrix}$$

The film thickness measurement Y is a 3×1 vector, wherein $Y=[Y_{t,u}, Y_{t,c}, Y_{t,l}]$, and the $Y_{t,u}$, $Y_{t,c}$, $Y_{t,l}$ are film thickness measurements for wafers processed in upper, central, and lower positions of the furnace tube. The temperature setting T is a 5×1 vector, wherein $T=[T_{t,1}, T_{t,2}, T_{t,3}, T_{t,4}, T_{t,5}]$, and the $T_{t,1}$, $T_{t,2}$, $T_{t,3}$, $T_{t,4}$, and $T_{t,5}$ are temperature settings for five heating elements for process run t. The slope coefficient matrix B is a preset constant determined according to temperature settings and film measurements of a plurality of prior process runs.

The film thickness measurement is proportional to the product of the slope coefficient matrix and the temperature settings. The slope coefficient matrix can be changed to meet particular needs. For example, for a four-sensor Kauno Elektrine (KE) furnace, the slope coefficient matrix is a (3×4) matrix, and the matrix differs for different process recipes.

Second, a first heating model is defined (step S22). The heating model comprises a first temperature setting for the heating element 111.

Next, a first process run of a first wafer batch is performed as defined by the first heating model (step S23).

After the thermal process, at least 3 wafers of the wafer batch are inspected to obtain film thickness measurements (step S24). The inspected wafers are positioned at upper, central, and lower positions of the furnace tube, respectively.

Next, a statistical process control analysis is performed using the slope coefficient matrix and the film thickness measurements obtained in step S24, wherein the film thickness measurements and a heating model of the latest process run are processed. The model 1 specifies a direct proportion for the aforementioned variables, and an initial intercept is determined using EWMA (exponentially weighted moving average) algorithm. According to this embodiment, an initial temperature setting is a 5×1 vector denoted as $T_0$, wherein $$T_0=[T_{0,1}, T_{0,2}, T_{0,3}, T_{0,4}, T_{0,5}].$$

In order to specify the relationship among film thickness measurements, the slope coefficient matrix, and the temperature setting, an intercept of model 1 is determined. An initial intercept is denoted as $\alpha_0$, wherein the $\alpha_0$ is calculated according to the following equation.

$$\alpha_0 = \begin{bmatrix} \alpha_{0,u} \\ \alpha_{0,c} \\ \alpha_{0,l} \end{bmatrix} = Y - BT_0$$

The $\alpha_{0,u}$, $\alpha_{0,c}$, and $\alpha_{0,l}$ are initial intercept of model 1 for wafers processed in upper, central, and lower positions of the furnace, and Y is a preset target film thickness. When film thickness measurement of process run t, denoted as $Y_t$, is available, a corresponding intercept at is determined according to the following equation.

$$\alpha_t = w(Y_t - BT_{t-1}) + (1-w)\alpha_{t-1}$$

The w is a preset weighting factor specifying weight of impact from the previous process run. According to the present, invention, w is 0.7 for the earliest 3 process runs. In other words, w is 0.7 when t is equal to or less than 3. When t exceeds 3, w decreases to 0.2. Thus $\alpha_t$ does not fluctuate greatly with film thickness measurement of current $_{process}$ run ($Y_t$) and current temperature setting ($T_{t-1}$) after the third process run. When $\alpha_t$ is determined, temperature setting for a subsequent process run ($T_t$) is determined accordingly. The $T_t$ is determined according to the following equation.

$$T_t = (I - B'(BB')^{-1}B)T_{t-1} + B'(BB')^{-1}(Y - \alpha_t)$$

The statistical process control analysis is implemented on an uninterrupted series of process runs. In other words, the statistical process control analysis cannot be applied on a series of process runs interrupted by a preventive maintenance (PM) or a long time interval. Thus, special design is required to prevent mis-operation resulting from an interrupted series of process runs.

In step S25, it is determined whether the film thickness measurement of the latest preceding process run is available, and if so, the method proceeds to step S26, otherwise to step S27. In step S26, it is determined whether a preventive maintenance (PM) was performed after the latest preceding process run, and if so, the method is complete, otherwise the method proceeds to step S28. In step 27, it is determined whether the film thickness measurement of a preceding process run other than the latest one is available, and if so, the method proceeds to step S291, otherwise the method is complete. In step S28, it is determined whether the time interval to the latest process run exceeds a preset time limit, and if so, the method is complete, otherwise the method proceeds to step S39. In step S291, a statistical process control analysis is performed using the slope coefficient matrix and the film thickness measurements. Then, the first heating model is modified according to results of the statistical process control analysis to obtain a second heating model (step S295). Then, it is determined whether the heating model conforms to a preset rule (step S30), and if so, the method proceeds to step S31, otherwise the method is complete. Next, a second process run of a second wafer batch is performed as defined by the second heating model (step S31).

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 3:
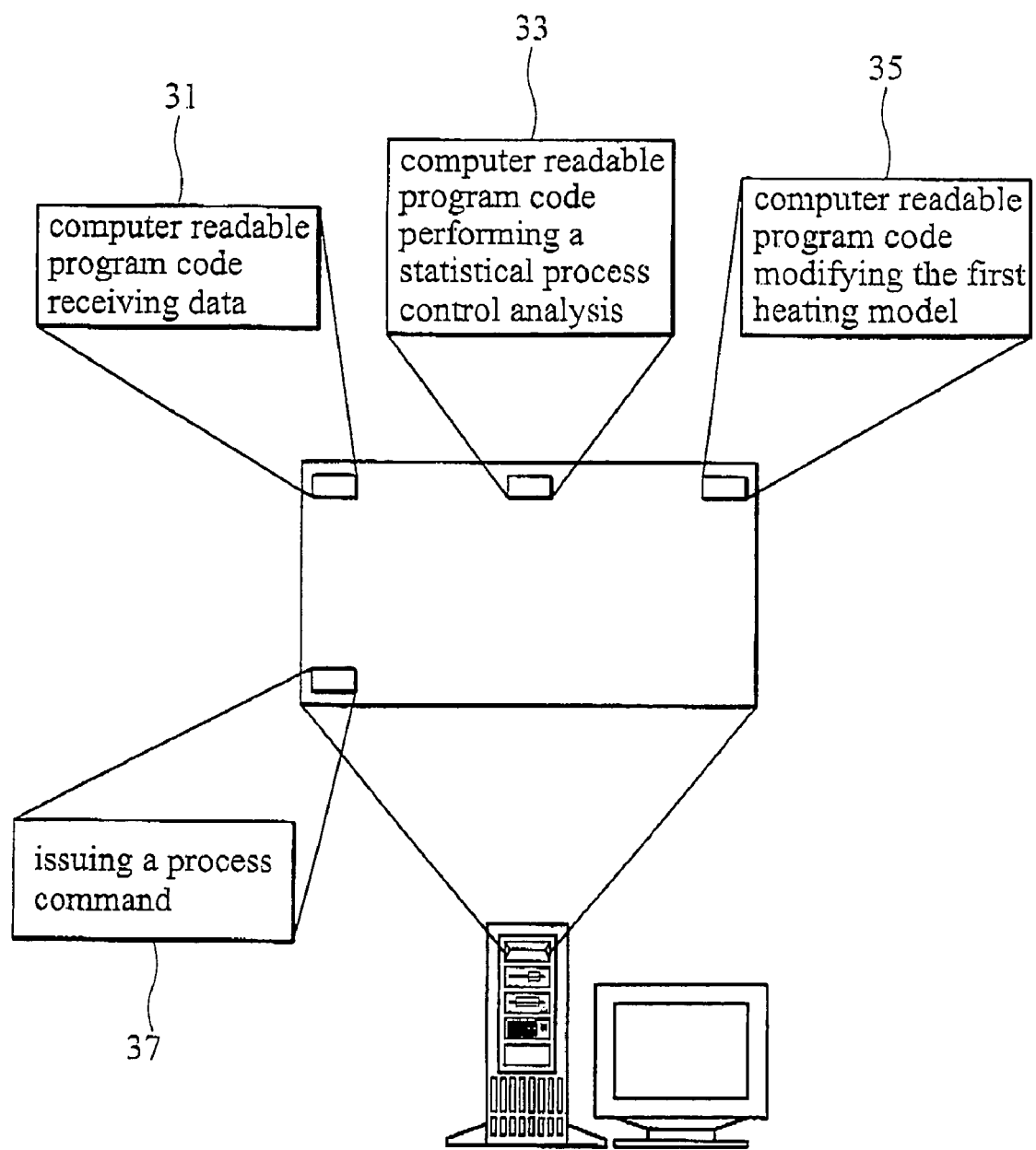
FIG. 3 is a diagram of a storage medium for storing a computer program providing a method for thermal process control according to the present invention.

FIG. 3 is a diagram of a storage medium for storing a computer program providing the thermal process control method according to the present invention. The computer program product comprises a computer usable storage medium having computer readable program code embodied in the medium, the computer readable program code comprising computer readable program code 31 receiving a slope coefficient matrix, a first heating model, and a first film thickness measurement, computer readable program code 33 performing a statistical process control analysis using the slope coefficient matrix and the film thickness measurement, computer readable program code 35 modifying the first heating model according to results of the statistical process control analysis to obtain a second heating model, and computer readable program code 37 issuing a process command, which directs a tool to process a second wafer batch according to the second heating model.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of thermal process control for a multi-zone thermal processor, wherein the multi-zone thermal processor comprises a plurality of heating elements, the method comprising:

providing a slope coefficient matrix;

defining a first heating model, wherein the first heating model comprises the relationship among film thickness measurements, slope coefficient matrix, and temperature settings for each of the heating elements in the multi-zone thermal processor;

performing a first process run of a first wafer batch as defined by the first heating model;

measuring film thickness of at least one wafer of the first wafer batch;

performing a statistical process control analysis using the slope coefficient matrix and the film thickness measurements;

modifying the first heating model according to results of the statistical process control analysis to obtain a second heating model; and performing a second process run of a second wafer batch as defined by the second heating model.

2. The method of claim 1, wherein the statistical process control analysis further processes a heating model and film thickness measurements of a prior process run when a heating model and film thickness measurements of the latest process run are unavailable.

3. The method of claim 1, wherein the statistical process control analysis further processes a heating model and film thickness measurements of a prior process run when a time interval from the latest process run exceeds a preset value.

4. The method of claim 1, wherein the statistical process control analysis further processes a heating model and film thickness measurements of a prior process run when a preventive maintenance has been performed after the latest process run.

5. The method of claim 1, wherein the slope coefficient matrix, a (M×N) matrix, is determined by design of experiment (DOE), wherein M is equal to the number of film thickness measurements for a certain process run and N is equal to the number of heating elements in a heating chamber performing the thermal process.

6. The method of claim 1, wherein the statistical process control analysis further determines a temperature compensation factor for the second heating model by EWMA (exponentially weighted moving average) algorithm.

* * * * *